United States Patent
Felten

(10) Patent No.: US 6,860,000 B2
(45) Date of Patent: Mar. 1, 2005

(54) METHOD TO EMBED THICK FILM COMPONENTS

(75) Inventor: John James Felten, Chapel Hill, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 142 days.

(21) Appl. No.: 10/314,634

(22) Filed: Dec. 9, 2002

(65) Prior Publication Data

US 2003/0154592 A1 Aug. 21, 2003

Related U.S. Application Data

(60) Provisional application No. 60/357,183, filed on Feb. 15, 2002.

(51) Int. Cl.[7] .............................................. H01C 17/00
(52) U.S. Cl. .................... 29/610.1; 29/620; 29/621; 29/829; 29/830; 29/832; 29/847; 174/259; 338/253
(58) Field of Search ................. 29/610.1, 620, 29/621, 829, 830, 832, 847; 174/259; 338/253, 254

(56) References Cited

U.S. PATENT DOCUMENTS

| | | |
|---|---|---|
| 3,808,576 A | 4/1974 | Castonguay et al. |
| 5,652,055 A * | 7/1997 | King et al. ................ 428/343 |
| 6,263,243 B1 | 7/2001 | Lang |
| 6,317,023 B1 * | 11/2001 | Felten ....................... 338/254 |
| 6,500,350 B1 * | 12/2002 | Hunt et al. .................. 216/16 |

FOREIGN PATENT DOCUMENTS

| | | |
|---|---|---|
| EP | 0 869 705 A1 | 10/1998 |
| JP | 59-138304 | 8/1984 |
| JP | H2-153589 | 6/1990 |
| WO | WO 98/39784 | 9/1998 |

* cited by examiner

Primary Examiner—Carl J. Arbes
Assistant Examiner—Tim Phan

(57) ABSTRACT

The invention is directed to a method to embed a thick film resistor composition into a printed wiring board comprising the steps of applying a reinforcing composition onto a resistor composition disposed on a metallic substrate forming an assembly wherein the resistor composition is at least partially coated with the reinforcing composition; processing the assembly; and applying the assembly onto at least one side of an organic substrate forming a component wherein the organic substrate is at least partially coated with an adhesive layer and wherein the reinforcing composition side of the assembly is embedded into the adhesive layer. The reinforcing composition allows laser trimming of the fired resistor and also eliminates cracking during lamination steps of the invention.

18 Claims, 2 Drawing Sheets

METHOD TO EMBED THICK FILM COMPONENTS

CROSS-REFERENCE TO RELATED DOCUMENT

The present application claims the benefit of Provisional Application No. 60/357,183, which was filed on Feb. 15$^{th}$, 2002.

FIELD OF THE INVENTION

The present invention is directed to a method wherein a reinforcing layer is found between a substrate and a thick film resistor component, and, optionally, added is an encapsulant layer covering the thick film resistor component. The reinforcing layer reduces cracking of the component while undergoing embedment which is typically by lamination. The reinforcing layer also enables laser trimming of the resistor component.

BACKGROUND OF THE INVENTION

Passive components today exist as a carrier substrate with built-in passive compositions usually derived from resistor or dielectric thick film technology, which are terminated by metal conductors. The components are mounted on a surface of a printed wiring board (PWB) one at a time with pick and place equipment, and connected electrically to a circuit by one of several complex processes which may involve adhesives, fluxes, solder composition, wave soldering, or reflow.

As the demand for miniaturizing electronic devices increases, both circuit density and the density of components per unit area have dramatically increased. The number of components has risen exponentially, necessitating the shrinking of component size. Since the design of smaller, denser boards is approaching the practical limit for today's technology, circuit designers have maximized real-estate and cannot add components unless they become much smaller for surface mounting, or buried within the inner layers, i.e., vertical stacking of components. It is desirable to have components resulting from thick film compositions within the embedded layers. Thick film resistor and dielectric compositions are an existing technology, such that a viscous thick film composition is screen-printed in a desired design, then fired at a temperature to burn out organic components and sinter the inorganics. The result is a thick film component embedded into the circuitry.

Although thick film resistors are thin enough to embed, they cannot be printed directly on a printed wiring board because of a firing step in the manufacturing process. The resistor composition can be printed and fired on a fireable substrate, and then laminated to the board. However, there is a tendency for the fired components to crack during lamination, thereby reducing yields. A method is needed to allow lamination of thick film components to a printed wiring board with reduced incidence of cracking.

A further obstacle to using thick film resistors on a printed wiring board is that they cannot be laser-trimmed using present technology. Laser trimming is a method of adjusting the resistance of a fired thick film resistor. The resistance is measured, and the change in width needed to achieve the proper resistance is calculated. A laser makes a cut through the thick film resistor, partway across the current path. This cut reduces the effective width of the thick film resistor and raises the resistance to the desired value. When trimming is done on a printed wiring board, the laser cuts through the thick film resistor and burns the board. The burned material can form a conductive carbon bridge across the cut path, which can lower the resistance of the thick film resistor and/or cause drifting of the resistance. The present invention solves the problem of laser trimming printed thick film resistors on organic substrates such as printed wiring boards and, also, solves the problem of cracking during lamination.

SUMMARY OF THE INVENTION

The present invention is directed to methods for embedding thick film components within a circuit board comprising the steps of:

(a) applying a reinforcing composition onto a resistor composition disposed on a metallic substrate forming an assembly wherein the resistor composition is at least partially coated with the reinforcing composition;

(b) processing the assembly; and (c) applying the assembly onto at least one side of an organic substrate forming a component wherein the organic substrate is at least partially coated with an adhesive layer and wherein the reinforcing composition side of the assembly is embedded into the adhesive layer.

DETAILED DESCRIPTION OF THE INVENTION

Figure 1A:
FIG. 1 is a schematic of a general method of the invention.

The invention is directed to a method for embedding thick film components into a circuit board wherein a reinforcing layer is utilized. The reinforcing layer increases the strength of the thick film component thereby reducing the incidence of cracking during lamination. The benefit occurs during lamination of a flexible metallic substrate carrying the components to a circuit board and additionally when layers of circuitry are laminated on top of the thick film components. Use of an encapsulant layer and a reinforcing layer, such that the thick film components are sandwiched between, further reduces cracking.

The reinforcing layer also acts as a barrier to protect the underlying substrate during laser trimming of a thick film resistor component. The layer prevents burning of the underlying substrate and carbon-bridging of the thick film resistor components. The laser trimming can be done with or without the presence of an encapsulating layer.

Thick Film Composition

Thick film compositions are used for resistors and dielectrics; electrically nonconductive reinforcing and encapsulant layers; and conductive underprints in the present invention. Thick film resistor, conductor and dielectric compositions are well known in the industry and commercially available. Generally, there are two main types of thick film compositions that may be utilized in this invention. Both are conventional products sold in the electronics industry. First, thick film compositions wherein the organics of the compositions during processing are burned or fired out are referred to as "fireable thick film compositions." They typically comprise conductive, resistive or dielectric powders and inorganic binder dispersed in organic medium. Prior to firing, a processing requirement may include an optional heat treatment such as: drying, curing, reflow, soldering and others known to those skilled in the art of thick film technology. Second, thick film compositions that typically comprise conductive, resistive or dielectric powders and are dispersed in an organic medium wherein the compositions during processing are cured and the organics remain are referred to as "polymer thick film compositions." Fireable thick film compositions and polymer thick film compositions are generally referred to herein as "thick film compositions" unless more specifically stated. "Organics" comprise polymer components of a thick film composition.

In conductor applications, such as when a conductive underprint is used in the method of the invention, the functional phase of the thick film composition is comprised of electrically functional finely divided conductor powder. The electrically functional powders in a given thick film composition may comprise a single type of powder, mixtures of powders, alloys or compounds of several elements of powder. Examples of such powders include: gold, silver, copper, nickel, aluminum, platinum, palladium, molybdenum, tungsten, tantalum, lanthanum, gadolinium, ruthenium, cobalt, titanium, yttrium, europium, gallium, and alloys and combinations thereof and others common in the art of thick film compositions. Typically, the conductor powder found in the underprint fireable thick film composition is matched to the metal component found in a metallic foil substrate that is used in the processes herein.

In resistor thick film compositions, the functional phase is generally a conductive oxide powder such as $RuO_2$. Examples of a conductor phase in a commercially available thick film resistor composition are chosen from $RuO_2$, $SnO_2$, TaN, and $LaB_6$. Other examples include ruthenium pyrochlore oxide which is a multi-component compound of $Ru^{+4}$, $Ir^{+4}$ or a mixture of these (M"), said compound being expressed by the following general formula:

$$(M_xBi_{2-x})(M'_yM''_{2-y})O_{7-z}$$

wherein

M is selected from the group consisting of yttrium, thallium, indium, cadmium, lead, copper and rare earth metals, M' is selected from the group consisting of platinum, titanium, chromium, rhodium and antimony, M" is ruthenium, iridium or a mixture thereof, x denotes 0 to 2 with a proviso that $x \leq 1$ for monovalent copper, y denotes 0 to 0.5 with the proviso that when M' is rhodium or two or more of platinum, titanium, chromium, rhodium and antimony, y stands for 0 to 1, and z denotes 0 to 1 with a proviso that when M is divalent lead or cadmium, z is at least equal to about x/2.

These ruthenium pyrochlore oxides are described in detail in U.S. Pat. No. 3,583,931. The preferred ruthenium pyrochlore oxides are bismuth ruthenate ($Bi_2Ru_2O_7$) and lead ruthenate ($Pb_2Ru_2O_6$).

In dielectric or nonconductive compositions, the functional phase which imparts nonconducting properties is generally a glass, ceramic or nonconductive filler. Dielectric thick film compositions are nonconducting compositions or insulator compositions that separate electrical charges and may result in the storage of an electrical charge. They are used for the nonconductive reinforcing and encapsulant compositions of this invention. The thick film dielectric compositions typically contain ceramic powders, oxides and/or non-oxide frits, crystallization initiators or inhibitors, surfactants, colorants, organic mediums, and other components common in the art of thick film dielectric compositions. Some examples of ceramic solids include: alumina, titanates, zirconates, stannates, $BaTiO_3$, $CaTiO_3$, $SrTiO_3$, $PbTiO_3$, $CaZrO_3$, $BaZrO_3$, $CaSnO_3$, $BaSnO_3$, $Al_2O_3$, glass and glass-ceramic. It is also applicable to precursors of such materials, i.e., solid materials which upon firing are converted to dielectric solids, and to mixtures thereof.

The powders described hereinabove are finely dispersed in an organic medium and are optionally accompanied by inorganic binders, metal oxides, ceramics, and fillers, such as other powders or solids. The function of an inorganic binder in a thick film composition is binding the particles to one another and to the substrate after firing. Examples of inorganic binders include glass binders (frits), metal oxides and ceramics. Glass binders useful in the thick film composition are conventional in the art. Some examples include borosilicates and aluminosilicates glasses. Examples further include combinations of oxides, such as: $B_2O_3$, $SiO_2$, $Al_2O_3$, CdO, CaO, BaO, ZnO, $SiO_2$, $Na_2O$, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof.

The functional phase and any other powders are typically mixed with an organic medium by mechanical mixing to form a paste-like composition having suitable consistency and rheology for printing. A wide variety of inert liquids can be used as organic medium. The organic medium must be one in which the solids are dispersible with an adequate degree of stability. The rheological properties of the medium must be such that they lend good application properties to the composition. Such properties include: dispersion of solids with an adequate degree of stability, good application of composition, appropriate viscosity, thixotropic, appropriate wettability of the substrate and the solids, a good drying rate, good firing properties, and a dried film strength sufficient to withstand rough handling. The organic medium is conventional in the art and is typically a solution of the polymer in solvent(s). In fireable thick film compositions the most frequently used polymer for this purpose is ethyl cellulose. Other examples of polymers include ethylhydroxyethyl cellulose, wood rosin, mixtures of ethyl cellulose and phenolic polymers, polymethacrylates of lower alcohols, and monobutyl ether of ethylene glycol monoacetate can also be used. The most widely used solvents found in fireable thick film compositions are ethyl acetate and terpenes such as alpha- or beta-terpineol or mixtures thereof with other solvents such as kerosene, dibutylphthalate, butyl carbitol, dibutyl carbitol and other glycol ethers, butyl carbitol acetate, hexylene glycol and high boiling alcohols and alcohol esters. Various combinations of these and other solvents are formulated to obtain the viscosity and volatility requirements desired.

In addition, the thick film composition can also include other metal particles and inorganic binder particles to enhance various properties of the composition, such as adhesion, sintering, processing, brazeability, solderability, reliability, etc., during processing. Oxalic acid catalyzed alkyl t-butyl/amyl phenolic polymer is an example of an adhesion promoter used to increase adhesion of the thick film composition to a support which is further described hereinbelow.

In a fireable thick film composition, when firing in the 300 to 1000° C. temperature range, adhesion of the thick film composition to the substrate is generally achieved by the melted glass frit(s) wetting the substrate. The inorganic binder (glass frits, metal oxides and other ceramics) portion of the thick film composition is the focus of adhesion to the substrate. For example, in a traditional thick film conductor composition firing, the sintered metal powders are wetted or interlocked by the inorganic binder, at the same time, the inorganic binder wets or interlocks with the substrate, thus, producing adhesion between the sintered metal powders and the substrate. Hence, for thick film functionality, it is important that the patterning technology deposits a well dispersed thick film composition with all the necessary ingredients within prescribed quantities. For firing temperatures above 1000° C., in addition to inorganic binder wetting/interlocking adhesion mechanisms, other interactions and compound formation could contribute to adhesion mechanisms.

Polymeric thick film compositions are mainly made up of conductive, resistive or dielectric powders, such as those discussed hereinabove, dispersed in an organic medium containing polymer and/or natural and/or synthetic resin (herein referred to as "polymer") and solvent, typically volatile solvent and a polymer. They typically do not include glass frit since they are cured and not fired. Polymers useful are well known in the industry. Polyimides and polyacrylates are suitable. The binder can also be a cross-linkable polymer. This allows the nonconductive composition to harden during curing. The cross-linkable polymer can be an epoxy resin. Some examples of typical polymers employed in polymeric thick film compositions are polyesters, acrylics, vinyl chlorides, vinyl acetates, urethanes, polyurethanes, epoxies, phenolic resin systems, or mixtures thereof. The organic medium is preferably formulated to give appropriate wettability of the particles and the substrate, good drying rate, dried film strength sufficient to withstand rough handling. Satisfactory appearance of the dried composition is also important.

Solvents suitable must dissolve the polymer. Some examples of solvents are listed: propylene glycol monomethyl ether acetate, methyl propanol acetate, 1-methoxy-2 propanol acetate, methyl cellosolve acetate, butyl propionate, primary amyl acetate, hexyl acetate, cellosolve acetate, pentyl propionate, diethylene oxalate, dimethyl succinate, dimethyl glutarate, dimethyl adipate, methyl isoamyl ketone, methyl n-amyl ketone, cyclohexanone, diacetone alcohol, diisobutyl ketone, n-methyl pyrolidone, butyrolactone, isophorone, methyl n-isopropyl ketone. Various combinations of these and other solvents are formulated to obtain the desired viscosity and volatility requirements for the process that the polymer thick film composition is to be employed.

In polymer thick film compositions, the organic medium is required to impart the necessary adhesion to the desired substrate; and it, also, provides the composition with the required surface hardness, resistance to environment changes and flexibility. Additives, as known to those skilled in the art, may be employed in the organic medium to fine-tune the viscosity for printing.

After applying a polymer thick film composition on a base material, the composition is typically dried by heating at temperatures of up to about 150° C. which causes the volatile solvents to be driven off or dried. After drying, depending on the application, the composition will undergo a curing process wherein the polymer will bind the powder to form a circuit pattern or other desired result. In order to obtain the desired end properties, one skilled in the art knows it is important that the thick film composition contains an optimized amount of each of the desired ingredients to meet the end result. An optimized amount of each ingredient is important to achieve the desired thick film conductor, resistor and dielectric properties. The properties needed may include coverage, density, uniform thickness and circuit pattern dimensions, electrical properties such as: resistivity, current-voltage-temperature characteristics, microwave, radio-high frequency characteristics, capacitance, inductance, etc.; interconnection characteristic properties, such as: solder or braze wetting, compression and wire bonding, adhesive joining, and junction characteristics; optical properties, such as: fluorescence; and other initial and aged/stress testing properties that may be required.

Typically, in formulating a thick film composition the solids are mixed with an organic medium by mechanical mixing using a planetary mixer, then dispersed on a three-roll mill to form a composition having suitable consistency and rheology for screen printing. The latter is printed as a "thick film" on a substrate in the conventional manner. Dispersion methods other than three-roll milling are also possible, including power mixing. These dispersion methods are well known in the industry.

The ratio of vehicle to solids in the dispersions can vary considerably and depends upon the manner in which the dispersion is to be applied and the kind of organic medium used. Good coverage can be obtained with dispersions that contain complementarily 30–91% solids and 70–9% vehicle, as described above. The compositions of the present invention can, of course, be modified by the addition of other materials, which do not affect its beneficial characteristics. Such formulations are well within the state of the art.

The compositions can be conveniently prepared on a three-roll mill or power-mixer. The viscosity of the compositions can be within the following ranges when measured on a viscometer at low, moderate, and high shear rates:

| Shear Rate (sec$^{-1}$) | Viscosity (Pa · s) |
| --- | --- |
| 0.2 | 100–5000 |
|  | 300–2000 |
|  | 600–1500 |
| 4 | 40–400 |
|  | 100–250 |
|  | 120–200 |
| 40 | 10–150 |
|  | 25–120 |
|  | 50–100 |

Reinforcing Composition

The reinforcing composition may be either a fireable or a polymer thick film composition as described above depending on the desired application and use. One component of the composition is nonconductive solids or refractive fillers.

The purpose of the nonconductive solids in the reinforcing composition is twofold: (1) to diffract a laser beam as quickly as possible to prevent it from cutting deeply into the substrate during laser trimming of a resistor, and (2) to provide added strength and stiffness to the metal foil with fired resistors and/or other thick film components when it is laminated onto a printed wiring board core or into a multilayer board.

The ability to diffract light limits the number of choices of filler. Light is refracted by fillers in coatings in proportion to the difference between the refractive index of the filler and that of the polymeric matrix used in the coating. If the refractive index of the filler and the organic matrix are identical, the coating will appear transparent to the eye. Since most organic polymers have a refractive index of 1.35 to 1.6 or so, a refractive index significantly higher than that of the organic matrix is necessary. Examples of the preferred fillers follow:

| Filler | Approx. Refractive Index |
| --- | --- |
| Lead Oxide (PbO) | ~2.6 |
| Titanium Dioxide (TiO$_2$) | ~2.5 |
| Zirconium Oxide (ZrO$_2$) | ~2.3 |
| Zinc Oxide (ZnO) | ~2.0 |
| Aluminum Oxide (Al$_2$O$_3$) | ~1.75 |

Of these, lead oxide is toxic, and zirconium oxide is relatively expensive. The zinc oxide and aluminum oxide are significantly less refractive than the first three. Zinc is used cosmetically in sun blockers to prevent sunburn. Titanium dioxide is nontoxic and relatively inexpensive, making it the most popular white pigment for paints and coatings; it is also preferred as a refractive filler for the reinforcing layer of the reinforcing composition. It keeps the laser from completely ablating the reinforcing layer, and provides for complete removal of surrounding binder, so that carbon-bridging and dirty or unstable trimming does not occur. The term carbon-bridging refers to residual carbon in the laser-trimmed area that acts as a conductor and alters the resistance of the thick film resistor. It also causes the resistance value to drift substantially during post-laser trim stability tests and other subsequent processing.

A mixture of fillers is also useful. For example, mixtures of aluminum oxide and titanium dioxide can be used. In addition, a mixture of particle sizes can be used which will increase the solids loading in the composition. It is advantageous to increase the solids loading because it reduces the amount of organic material that is utimately burned out during the laser trimming.

The quantity of nonconductive filler used should be sufficient to reduce the incidence of cracking in the thick film components. It should also be sufficient to prevent damage to the underlying substrate during laser trimming. A suitable amount of nonconductive filler is about 35 to 75 percent by weight based on total composition.

The incidence of cracking of the thick film components can be further reduced by use of a reinforcing layer with a high glass transition temperature ($T_g$). A higher $T_g$ will ensure that the reinforcing layer remains rigid despite the elevated temperatures used for lamination. A rigid reinforcing layer prevents the transfer of stresses into the thick film components so that they are not deformed and cracked. Polyimides have a very high $T_g$ of over 200° C., while laminations are typically done at 150° C., which makes them a particularly suitable binder for the nonconductive compositions. A high $T_g$ is also desirable for an encapsulant layer, where additional layers are to be laminated to the substrate on top of the thick film components. For example, bisphenol-A/formaldehyde/epichlorohydrin is a suitable epoxy polymer. Such a polymer is commercially available from Shell as EPON® 862.

The nonconductive composition ingredients may contain a cross-linkable polymer and a cross-linking agent. A cross-linking agent causes the cross-linkable polymer to cross-link and harden during curing. This hardening makes the reinforcing layer or encapsulant layer more durable. Not all cross-linking agents will cross-link all cross-linkable polymers. The two components are chosen as a system. Such paired systems are well known in the art. Some systems can be cured with heat, while others can be cured by ultra-violet radiation. For example, cyanoguanidine is a suitable cross-linking agent to produce an epoxy cross-linked polymer. Cyanoguanidine is commercially available from SKF, Inc. This system can be cured with heat. The quantity of cross-linking agent used should be sufficient to make the nonconductive composition harden during curing. A suitable amount of cross-linking agent is 2 to 4 percent by weight of the total ingredients.

Some cross-linkable polymer/cross-linking agent systems cure very slowly. The curing rate might be too slow for a commercially feasible process. Where cross-linkable polymer is used, an accelerating agent can be included in the nonconductive composition ingredients to hasten the curing. The choice of accelerating agent used will depend on the cross-linkable polymer and/or cross-linking agent and curing method used. Suitable combinations are well known in the art. A carbamide compound is a suitable thermal accelerating agent for an epoxy system. DYHARD® UR500 is a suitable thermal-accelerating agent for an epoxy/cyanoguanidine system and is commercially available from SKF, Inc. The quantity of accelerating agent used can be sufficient to shorten the time needed for curing of the cross-linkable polymer to a desired time. A suitable amount of accelerating agent is 0.1 to 2 percent by weight of the total ingredients.

A solvent can be included in the nonconductive composition ingredients to obtain a desired rheology for print thickness. Diethylene glycol dibutyl ether is an example of a suitable solvent for an epoxy system.

Other nonconductive compositions are also within the scope of the invention, which may be cured as described above or fired. The term "processing" includes curing or firing. The reinforcing composition is generally applied by screen printing, but other application methods within the art of thick film compositions are suitable.

Process

The process of the invention is described hereinbelow. FIG. 1 is used to schematically illustrate the process. The first step is to obtain a metallic substrate (101). The metallic substrate should be flexible to allow for lamination to a substrate. The metallic substrate can be a metal foil. Metal foils are available in the electronics industry. For example, numerous types of metallic foils such as copper foils are available and widely used in the printed circuit board industry and the foils generally have different adhesion properties designed for different applications. For instance, there are reverse treated copper foils and double treated copper foils that provide a rougher surface that improves adhesion in printed circuit boards. Electrodeposited copper foils can also have improved adhesion in some applications. Single sided drum treated and roll annealed copper foils tend to have a smoother surface which would not be expected to provide adequate adhesion to most thick film compositions where mechanical interlocking mechanisms are the preferred bonding approach. There are also a variety of coatings applied to commercial grades of copper foils used in the printed circuit board industry for purposes of improved adhesion, reduced tarnishing, or other reasons. These include nickel-coated and zinc-coated copper foils. Copper foils of various types for printed circuit board applications are available from companies such as Gould and Oak-Mitsui. In addition to the above, other suitable metal foils can include silver, gold, aluminum, nickel, or iron foil. Typical foil thicknesses are about 5–250 $\mu$m. Thicknesses of 10–150 $\mu$m are preferred and 15–50 $\mu$m are more preferred.

In some of the processes, such as those involving resistor composition applications, adhesion of a fired thick film resistor composition to a substrate is known in the art to be influenced by a number of factors including resistor composition and the nature of the substrate surface. In terms of resistor composition, a key factor is the type and volume content of glass frit in the thick film composition with more glass frit generally leading to better bonding. There are also other additives found in the thick film composition that are known in the art that can create reaction bonds with substrate surfaces by forming new compounds at the interface between the thick film composition and the substrate during the firing process. Finally, a common mechanism for adhesion of thick film compositions and substrates is a simple mechanical interlocking mechanism which depends upon the substrate surface roughness.

In one embodiment, as shown in FIG. 1a, it is necessary to form an underprint (110) on the metallic substrate. The underprint will allow a resistor composition to adhere to a metallic substrate. The underprint must have good adhesion to both the metallic substrate and to fired thick film components. A suitable method to prepare an underprint is to apply a layer of thick film conductor composition to the metallic substrate, then fire the metallic substrate.

The metal found in the underprint composition can be matched to the metal found in the metallic substrate. For example, if a copper foil were used, then a copper composition can be utilized as the fireable underprint composition. Examples of other applications would be pairing silver, gold, and nickel foils with a similar metal thick film underprint composition.

The thick film underprint composition can be applied as an open coating over the entire surface of the metallic substrate or on selected areas. The method of screen-printing can be used to apply the thick film underprint composition. Areas can also be selected through a printing and etching process. When copper foil is used and the foil is to be fired in an oxygen-doped atmosphere, the entire surface of the foil should be coated. The glass in the copper composition retards oxidative corrosion of the copper foil.

The applied thick film conductor composition is dried to remove solvents, then fired at a high temperature to burn out the organics and sinter the remaining ingredients. The firing can be done below either the softening or melting point of the metal. When copper composition and copper foil are used, the copper composition can be dried at 120–130° C. and fired at 900° C. in a nitrogen atmosphere.

Silver foil is an alternative to copper foil. When silver foil is used, air fired resistors can be used, since silver is stable in air firing. Air fired resistors can have superior electrical properties. Silver has a higher cost, a propensity to migrate under electric fields where moisture is present, and an etching process is well known in the industry. The metal found in the metallic substrate will upon processing be the terminations for the components and, optionally, circuit traces for that layer. This process is further described in U.S. Pat. No. 6,317,023, which is incorporated herein as reference.

Figure 1B:
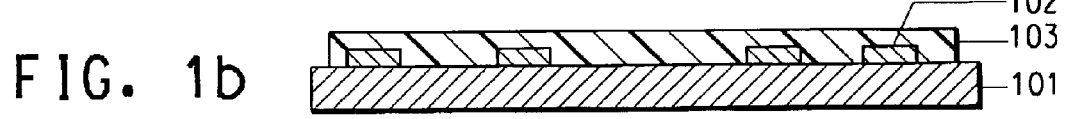
Figure 1C:
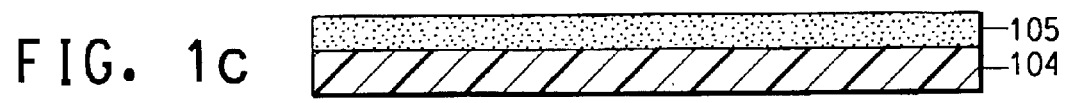
Figure 1D:
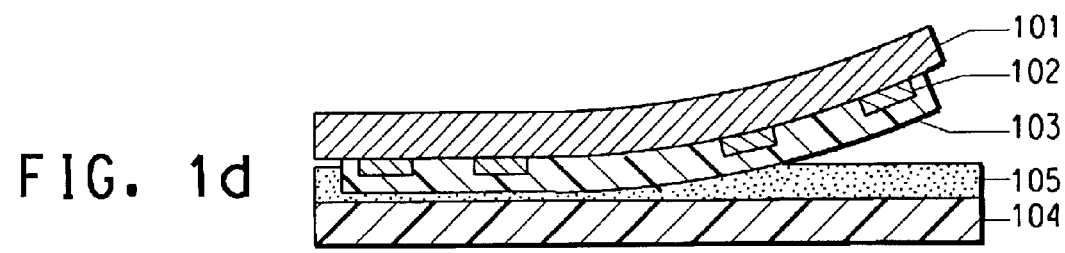
Figure 1E:
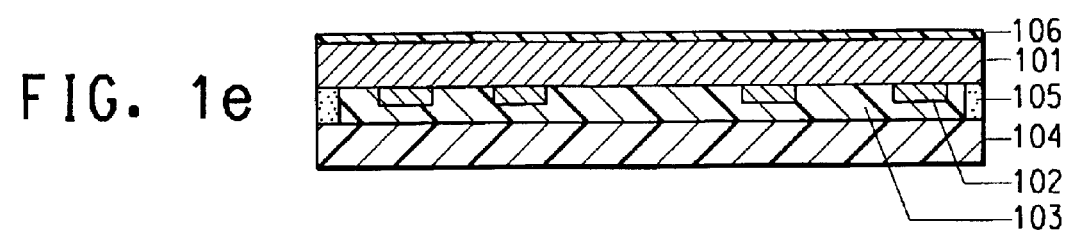

The next step is to apply one or more thick film resistor compositions and/or thick film dielectric compositions 102 to the metallic substrate. If an underprint is present, the composition(s) 102 should be applied to the underprint side of the foil substrate. Screen-printing, ink-jet or any other method known in the art of thick film technology can be used to apply the compositions. These wet compositions 102 are then dried to remove solvent and fired. The firing is typically done below the softening or melting point of the metal. The fired compositions are referred to as "thick film components." This term "thick film components" is a general term and may refer for example to "thick film resistor components" or "thick film dielectric components." The invention uses a reinforcing composition (FIG. 1(b)) (103) that is at least partially coated over the thick film components 102. The reinforcing composition forms a reinforcing layer. One means for applying the reinforcing composition is screen-printing. The reinforcing layer allows laser trimming of the thick film resistors without causing damage to the organic substrate. The reinforcing layer also prevents cracking of the thick film components. In other words, the reinforcing layer is coated on the thick film components for laser trimmability or for anti-cracking or for both laser trimmability and anti-cracking. In general, adhesion is promoted by use of a binder in the reinforcing composition that is chemically compatible to an organic substrate/adhesive layer. For example, the use of cross-linkable epoxy polymer will enhance adhesion of a polymer thick film composition to an epoxy prepreg adhesive layer 105 of an organic substrate (104) as illustrated in FIG. 1c. The reinforcing composition (103) may entirely cover the thick film component 102 as shown in FIG. 1(b). In one embodiment, the reinforcing composition 103 may extend beyond the edges of the thick film component, as illustrated in FIG. 1b. In another embodiment, the reinforcing composition may coat the entire metallic substrate as illustrated in FIG. 1e. The reinforcing composition is then cured forming a reinforcing layer. The curing process may be a heat or ultra-violet radiation process. Firing is possible with fireable thick film compositions when used as a reinforcing composition. Where the binder is a polymer, the nonconductive composition is cured with heat to remove the solvent and solidify the composition. Where the binder is a cross-linkable polymer, the curing will cross-link the polymer to solidify the composition.

The metallic substrate with the optional underprint, thick film components, and reinforcing layer are referred to as the lamination assembly. The lamination assembly is applied to a substrate (104) such as a printed wiring board (PWB). The substrate is impregnated with a adhesive or at least partially coated with at least one layer of adhesive (prepreg) (105), so that the thick film components and reinforcing layers sink into the adhesive to make a surface suitable for etching the terminations, as illustrated in FIGS. 1d and 1e. The reinforcing layers increase the strength of the thick film components and reduce the amount of cracking that would occur during lamination. Lamination assemblies can be laminated onto both sides of the substrate or onto one side of a substrate. The lamination assembly can also be laminated onto a substrate that already has one layer or more of circuitry on it.

Examples of substrates used in this invention can be the types of boards described hereinbelow. Generally, any substrate that is used in the electronics industry and sensitive to heat is a candidate for this process. All types of printed wiring boards such as high-pressure laminates may be used. By definition, a laminate consists of layers of fibrous materials bonded together under heat and pressure with a thermosetting polymer. It is typically an electrical-grade paper bonded with phenolic or epoxy polymer or a continuous-filament glass cloth bonded with an epoxy-polymer system. More specifically, some examples include:

XXXPC made from a high-quality electrical paper impregnated with a phenolic polymer;

FR-2 similar to Grade XXXPC, except a flame-retardant property;

FR-3 is self-extinguishing paper epoxy;

G-10 is a high-quality laminate made from sheets of glass cloth bonded with epoxy polymer;

FR-4 is quite similar to G-10, except for the added self-extinguishing property. G-11 is a glass-cloth-epoxy;

FR-5 is the flame-resistant modification of G-11.

The adhesive layers should be electrically insulating. Some adhesives are commonly called prepregs. Examples include epoxy, polymer, acrylic, or ceramic type adhesives. The thickness of the applied adhesive can be about 0.04 to about 0.2 millimeters. Some commercially available adhesives include DuPont THERMOUNT®, and PYRALUX WA® adhesives.

Figure 1F:
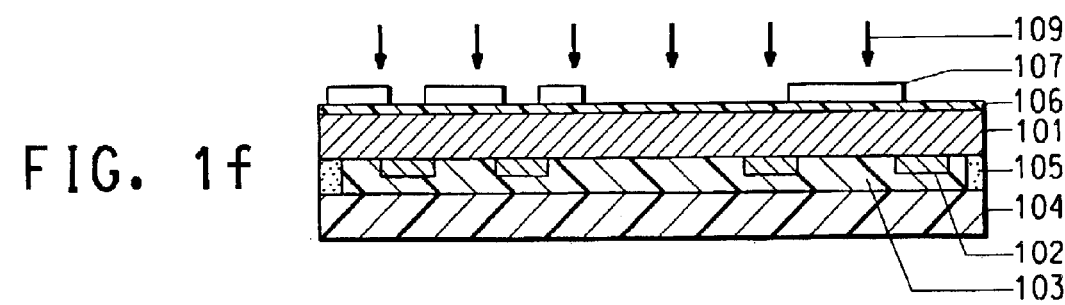
Figure 1G:
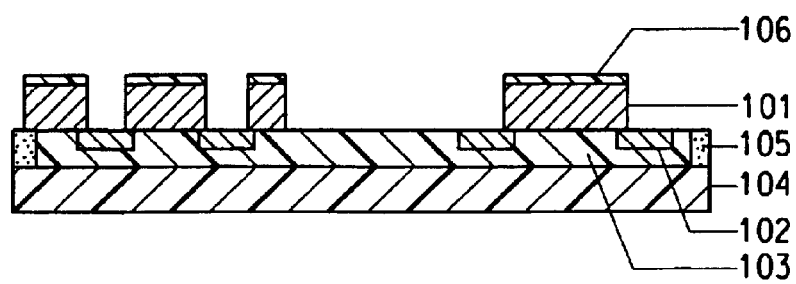
Figure 1H:
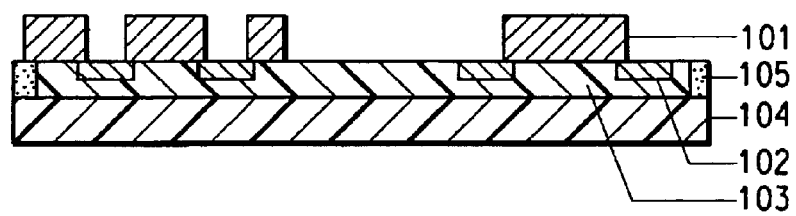

Optionally, circuit traces in addition to resistor terminations can be patterned and etched in the metallic substrate. Patterning and etching techniques are well known in the industry. More specifically, a photoresist such as DuPont RISTON® (106) is laminated onto the metal side of the substrate as illustrated in FIG. 1f. The photoresist is then exposed to UV light (109) through a patterned photomask (107) to generate a pattern of the metal terminations and optionally other circuit traces. The exposed photoresist is then developed, and the metal thus exposed is etched away to produce the terminations (and, optionally, circuit traces) as shown in 1(g). The photoresist is then stripped off, leaving the desired terminations and circuit traces as shown in 1(h).

Figure 1I:
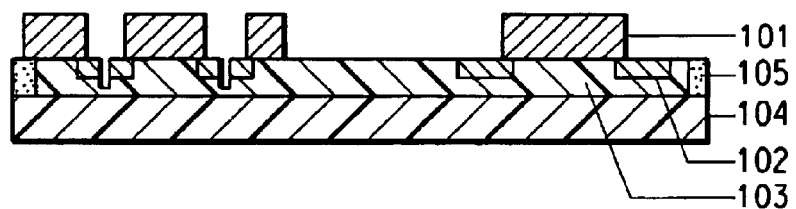

As illustrated in FIG. 1i, the exposed thick film components 102 can then be laser-trimmed. Laser-trimming techniques are well known in the industry. When thick film resistors are laser trimmed, the reinforcing layer 103 will avoid causing damage to the board and carbon-bridging. Eliminating carbon-bridging improves the electrical properties and stability of the resistors. Since power of the laser beam is adjustable, the power should be set high enough to cut completely through the thick film resistors, but not high enough to cut completely through the reinforcing layer 103 as shown in FIG. 1(i). It is still possible to cut through the reinforcing layer and damage the board if the laser power is too high. Therefore, the laser power used should be minimized. The use of the least amount of power that gives a clean cut through the resistor is preferred because excess power will generate carbonized material that can induce resistance drift.

When thick film dielectrics are laser trimmed, it is the metal termination that is trimmed. The thick film dielectric then blocks the laser and prevents damage to the underlying substrate. The reinforcing layer is not needed to prevent the damage. However, the reinforcing layer can still prevent cracking of the thick film dielectric.

Figure 1J:
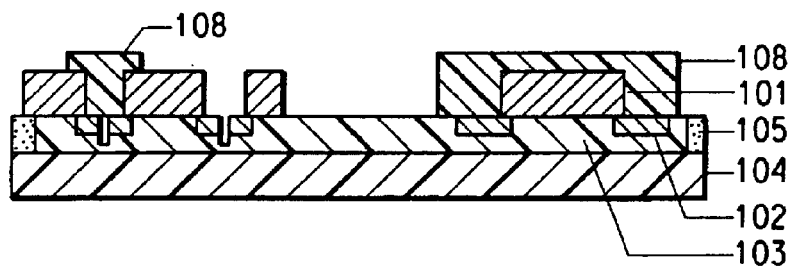

Optionally, at least one nonconductive composition FIG. 1(j) (108) can at least be partially coated on top of the thick film components as an encapsulant composition. This will further protect the thick film components from cracking in subsequent laminations and reduce electrical property drift due to stress induced by laminating. Screen-printing is one suitable method for applying the encapsulant composition.

Figure 1K:
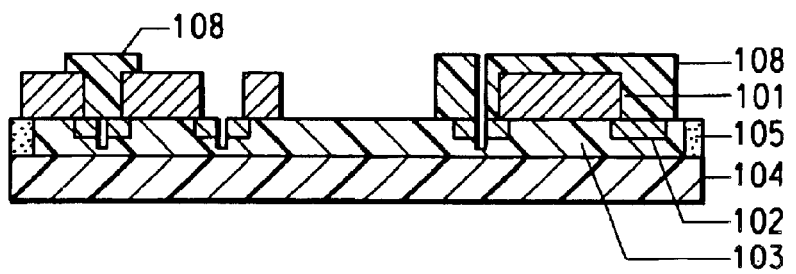

The cured encapsulant composition coated over the components may be one or more layers. The encapsulant layers can cover some or all of the thick film components, or the entire underlying substrate. It is possible to laser-trim the thick film components even after coating with a top encapsulant layer as shown in FIG. 1(k).

Suitable composition formulations, application methods, and processing conditions of the encapsulant composition may be identical to those for the reinforcing composition. When the thick film components are to be laser trimmed through the encapsulant layer, a nonconductive filler that does not scatter laser light should be used. Alumina is a suitable nonconductive filler for this purpose. Alumina can also be used in the reinforcing composition when the thick film components will be laser trimmed.

It is also possible to use an encapsulant layer with no reinforcing layer. It may help to prevent cracking in subsequent lamination steps.

The above process may be applied to double-sided builds. A lamination assembly would then be laminated to both sides of the substrate. Additional layers of circuitry can also be laminated or applied on top of the lamination assembly.

The present invention will be described in further detail by giving practical examples. The scope of the invention, however, is not limited in any way by these practical examples.

EXAMPLE 1

The metallic substrate was 1 oz. copper foil. The conductor composition was a copper composition with the following composition:

| | |
|---|---|
| TEXANOL ® | 15.00% (by weight) |
| Ethyl Cellulose | 0.75% |
| Glass A | 0.60% |
| Spherical Copper | 83.50% |
| Phosphate Wetting Agent* | 0.15% |

*TriDecyl Phosphate

Composition of Glass A:

| | |
|---|---|
| Silica | 9.4% (by weight) |
| $B_2O_3$ | 12.2% |
| Lead Oxide | 65.9% |
| Cadmium Oxide | 6.7% |
| Sodium Fluoride | 3.2% |
| Aluminum Oxide | 0.2% |

The conductor composition was applied by screen-printing and covered nearly the entire foil. It was dried at 130° C. and fired in a belt furnace at a maximum temperature of 900° C. in a nitrogen atmosphere for ten minutes. The total residence time in the furnace was one hour. The resistor composition was DuPont QP602 which is a $LaB_6$ based thick film resistor composition. The thick film resistor composition was screen printed in two sizes of small rectangles on the same metallic substrate: 20×50 mil and 30×55 mil. There were 96 of each size of thick film resistor on the substrate. The resistor composition was dried at 150° C. and fired at 900° C. in a nitrogen atmosphere using the same one hour total furnace residence time as the previous print.

The reinforcing composition was formed by mixing the following ingredients:

| | |
|---|---|
| EPON ® 862 epoxy polymer (Shell) | 35.5% (by weight) |
| cyanoguanidine | 2.4% |
| DYHARD ® UR500 carbamide (Shell) | 1.3% |
| titanium dioxide powder (0.3 μm) | 55.9% |
| diethylene glycol dibutyl ether | 4.9% |

The first three ingredients were mixed for 10 minutes with an air-driven power mixer with impeller. The titanium dioxide powder was added gradually and power mixed. When the viscosity became too high for good mixing of the composition, diethylene glycol dibutyl ether was added before adding more titanium dioxide powder. The reinforcing composition was screen-printed in large rectangles which completely covered and overlapped rows of resistors. Each rectangle covered 16 thick film resistors. The reinforcing composition was cured at 150° C. for one hour to cross-link the epoxy polymer.

A vacuum laminator press was used to laminate the lamination assembly to the underlying substrate, resistor side down. The underlying substrate was an 8 mil FR-4 core and the adhesive was 1.5 mil woven-glass-filled epoxy FR-4 prepreg. The lamination conditions were 208 psi and 165° C. for one hour under vacuum. DuPont RISTON® dry film photoresist was then laminated to the foil. The photoresist was covered with an artwork mask and exposed to UV light. The artwork was removed and the photoresist developed to expose parts of the copper foil to be etched away. The copper was etched and the remaining photoresist stripped off. The remaining copper formed test pads and circuit traces leading to the resistor terminations. The effective size of the resistors was 20×20 mil and 30×30 mil.

The resistance of each thick film resistor was measured. The thick film resistors were then laser-trimmed and measured again. Six different power settings for the laser were used: 0.6, 0.8, 1.0, 1.2, 1.5, and 1.8 watts. The Q rate was set to 2000 pulses/second, and the bite size was set to 0.1 mil. The thick film resistors were trimmed to targets of either 45 or 60 ohms. The laser trimming did not damage the boards and the cuts in the thick film resistors were clean and accurate. The boards were then checked for post-trim stability by heating at 120° C. for 15 minutes. The thick film resistors were measured again. The average percent change in resistance in the post-trim stability test was 1.5%.

EXAMPLE 2

The process from Example 1 was repeated with the following changes: QP601 (made by The DuPont Company and is a nitrogen fireable 10 ohm/sq $LaB_6$ based resistor composition) was used as the thick film resistor composition; the power settings were 1.2, 1.5, and 1.8 watts; and the target resistance was 14 ohms. The laser trimming did not damage the boards and the cuts in the thick film resistors were clean and accurate. The average percent change in resistance in the post-trim stability test was 1.2%.

What is claimed is:

1. A method for embedding a thick film resistor component into a printed wiring board comprising the steps of:

providing a metallic substrate;

applying onto at least a portion of the metallic substrate a thick film composition for forming a thick film component;

applying onto at least a portion of the metallic substrate a dielectric reinforcing composition to coat at least a portion of the thick film resistor composition disposed on at least a portion of the metallic substrate to form an assembly;

processing the assembly by subjecting to heat or UV radiation to form a lamination assembly comprising a reinforcing layer formed from the dielectric reinforcing composition and a thick film resistor component formed from the thick film resistor composition;

providing a substrate that is at least partially coated on one side with an adhesive layer for receiving the reinforcing layer and the thick film resistor component of the lamination assembly;

applying the lamination onto the at least partially coated side of the substrate to embed the thick film resistor component and dielectric reinforcing layer into the adhesive layer.

2. The method of claim 1 further comprising the steps of:

forming an underprint by applying a thick film conduct composition onto at least a portion of the metallic substrate prior to applying the thick film resistor composition; and, subjecting the substrate containing the thick film conductor composition to heat to form an underprint.

3. The method of claim 2 wherein the thick film conductor composition comprises the same metal as the metallic substrate.

4. The method of claim 1 further comprising the steps of:

applying a photoresist to the metallic substrate on the side opposite the thick film composition;

applying a patterned photomask to the photoresist;

exposing the photoresist to UV radiation to form an exposed thick film component; and developing the metallic substrate; and etching to remove the unexposed portions thereof.

5. The method of claim 4 further comprising the step of laser trimming the exposed thick film component.

6. The method of claim 5 further comprising the steps of applying a dielectric encapsulant composition to at least a portion of the thick film component and curing the encapsulant composition to form an encapsulant layer.

7. The method of claim 6 wherein the thick film component is laser trimmed through the encapsulant layer.

8. The method of claim 6 wherein the encapsulant composition comprises alumina.

9. The method of claim 1 wherein the metallic substrate is copper foil.

10. The method of claim 1 wherein the substrate is a high-pressure laminate.

11. The method of claim 1 wherein the reinforcing composition contains titanium dioxide.

12. The method of claim 1 wherein the assembly is subjected to heat.

13. The method of claim 1 wherein the assembly is subjected to UV radiation.

14. A device comprising an embedded thick film component and reinforcing layer formed according to the method of claim 1.

15. The method of claim 1, wherein the dielectric reinforcing composition comprises about 35 to 75 percent non-conductive fillers.

16. The method of claim 1, wherein the dielectric reinforcing composition is applied to entirely coat the thick film component.

17. The method of claim 1, wherein the dielectric reinforcing composition is applied beyond the edges of the thick film component.

18. The method of claim 1, wherein the dielectric reinforcing composition is applied to coat the entire metallic substrate.

* * * * *